(12) United States Patent
Goutti

(10) Patent No.: US 6,456,162 B1
(45) Date of Patent: Sep. 24, 2002

(54) OPERATIONAL AMPLIFIER WITH OFFSET VOLTAGE CENTERING, AND LOW-VOLTAGE COMPATIBLE

(75) Inventor: Frédéric Goutti, Grenoble (FR)

(73) Assignee: STMicroelectronics S.A., Gentilly (FR)

( * ) Notice: Subject to any disclaimer, the term of this patent is extended or adjusted under 35 U.S.C. 154(b) by 1 days.

(21) Appl. No.: 09/633,952

(22) Filed: Aug. 8, 2000

(30) Foreign Application Priority Data

Aug. 9, 1999 (FR) ............................................ 99 10321

(51) Int. Cl.[7] ................................................ H03F 3/45
(52) U.S. Cl. ...................................................... 330/257
(58) Field of Search ............................... 330/252, 257, 330/288

(56) References Cited

U.S. PATENT DOCUMENTS

| | | | | |
|---|---|---|---|---|
| 5,276,405 A | * | 1/1994 | Mazzucco et al. | 330/257 |
| 5,729,177 A | * | 3/1998 | Goutti | 330/257 |
| 5,936,468 A | * | 8/1999 | Wiese et al. | 330/257 X |

FOREIGN PATENT DOCUMENTS

EP 0072082 2/1983 ............. H03F/3/45

OTHER PUBLICATIONS

Ahuja Baxter Gray: "Programmierbarer CMOS–Interace–Prozessor für Telekomunikations–Anwendungen" Elektronik., No. 5, Mar. 1984, pp. 45–48, XP002135855.

Wurcer S: "A 3 NV/HZ, DC–Precise, JFET Operational Amplifier" Proceedings of the Bipolar Circuits and Technology Meeting, US, New York, IEEE, vol.–, 1989, pp. 116–119, XP000089832.

* cited by examiner

Primary Examiner—Steven J. Mottola
(74) Attorney, Agent, or Firm—Lisa K. Jorgenson; Allen, Dyer, Doppelt, Milbrath & Gilchrist, P.A.

(57) ABSTRACT

An operational amplifier includes an input stage, and a level-transforming stage with first and second arms. Each arm has at least one bipolar transistor. Input transistors are connected to the input stage and are connected together by their bases. At least one gain stage is connected to the transistor of the second transforming arm. A current terminal of the transistor on the first transforming arm is connected to its base by a bypass arm. In addition, the amplifier has a centering transistor connected by its base to the transistors on the arms of the transforming stage for controlling a current which conducts through the bypass arm.

23 Claims, 2 Drawing Sheets

OPERATIONAL AMPLIFIER WITH OFFSET VOLTAGE CENTERING, AND LOW-VOLTAGE COMPATIBLE

FIELD OF THE INVENTION

The present invention relates to integrated circuits, and, more particularly, to an operational amplifier that operates at a low supply voltage and has a low offset voltage.

BACKGROUND OF THE INVENTION

For an operational amplifier, low supply voltage refers to a voltage of around 1.8 V. This voltage corresponds to the voltage of two series connected batteries with a nominal voltage of 1.5 volts in a discharged state. In the discharged state, these batteries each have a voltage of around 0.9 volts. An amplifier capable of functioning with a voltage greater than or equal to 1.8 volts optimizes the energy available in battery powered devices. The use of such an amplifier, however, is not limited to battery powered devices.

Operational amplifiers are in various types of electronic circuits, and, in particular, circuits requiring a high current gain. An operational amplifier may be used in interface circuits, power stages, adding circuits, filters, etc. Moreover, operational amplifiers are particularly used in portable devices, such as headphones or mobile telephones, regardless of whether they are being powered by batteries. Moreover, operational amplifiers are particularly used in portable devices, such as headphones or mobile telephones, regardless of whether they are being powered by batteries.

An operational amplifier in accordance with the prior art is illustrated in FIG. 1. The amplifier has an input stage 100 with first and second input arms 102a, 102b, which form a differential pair of input arms. The input arms 102a, 102b each have an input transistor 104a, 104b respectively connected to input resistors 106a, 106b. Each input resistor 106a and 106b is respectively connected between a first supply terminal 1 and the collector of the corresponding input transistor 104a, 104b. In addition, the emitters of the input transistors are connected in common to a second supply terminal 22 by a biasing current source 108.

In the example in FIG. 1, the input transistors 104a, 104b are of the pnp type, and the first and second supply terminals 1, 2 are respectively a ground terminal and a supply terminal that is at a positive potential with respect to ground. The transistors 104a, 104b have substantially the same characteristics. The bases of the transistors 104a, 104b form input terminals 100a, 110b of the operational amplifier. A signal can be applied to the amplifier in the form of a potential difference between the input terminals 110a and 110b, thus forming a differential input. The potential difference applied between the input terminals has the effect of causing a differential current to flow in the input arms 102a and 102b. This is defined with respect to an idle state in which no voltage is applied to the input.

A second stage 200 of the amplifier is a level-transforming stage. It has first and second transforming arms 202a, 202b connected respectively to nodes 103a, 103b of the input stage. The nodes 103a and 103b are situated respectively between the input transistors and the input resistors of the first and second input arms 102a, 102b. The function of the level-transforming stages is to increase the voltage available at the nodes 103a and 103b so that the input resistors may drive a gain stage with sufficient voltage.

Each transforming arm has respective transistor 204a, 204b. The bases of these transistors are connected together by a node 205 so that they are commonly set to the same potential. The characteristics of the transistors 204a and 204b are substantially identical.

In the illustrated example, the transistors 204a, 204b of the first and second transforming arms are of the npn type and have emitters connected respectively to the nodes 103a, 103b of the input stage. The collectors of the transistors 204a, 204b are connected to the second supply terminal 2 by respective current sources 208a, 208b.

The transforming stage 200 also has a centering arm comprising a centering transistor 207 in series with a centering current source 209 between the first and second supply terminals. The centering current source 209 connects to the first supply terminal 1 the node 205 between the bases of the transistors 204a and 204b in the transforming arms.

In addition, the centering transistor has a collector connected to the second supply terminal 2, an emitter connected to the node 205 between the bases of the transistors 202a, 202b, and a base connected to the collector 203a of the transistor 204a in the first transforming arm 202a. The role of the centering arm is discussed in greater detail below.

A third stage of the amplifier is indicated with reference 300. This is a current gain stage which connects the level-transforming stage 200 to an output terminal 302.

A plurality of gain stages can be provided between the level-transforming stage 200 and the output terminal 302. In this case, the plurality of gain stages forms a gain chain. The input of the gain stage is represented by a transistor 304 whose base is connected to the collector 203b of the transistor 204b in the second transforming arm 202b. The transistor 304 is an npn bipolar type. Its emitter is connected to the first supply terminal 1 and its collector is connected to the second supply terminal 2 by a biasing current source 308.

The functioning of the amplifier of FIG. 1 is briefly described below. Considering that the input resistors 106a, 106b have identical values denoted Re, and considering that the transistors 204a and 204b in the transforming arms 202a and 202b have the same transconductance denoted $g_m$, it is possible to write:

$$\Delta I_s = \frac{g_m R_E}{1 + g_m R_E} \Delta I_E$$

In this equation $\Delta I_s$ indicates a total variation in the current conducted via the transistors in the input arms in response to a potential difference applied between the input terminals 110a and 110b. $\Delta I_E$ is the variation in the base current of the transistor 304 of the gain stage which results therefrom.

The value of $g_m$ is such that, where $$g_m = \frac{q I_{208}}{kT}.$$

The variable $I_{208}$ is the (identical) value of the biasing currents delivered respectively by the biasing sources 208a, 208b in the transforming arms 202a, 202b, k is Boltzmann's constant, q is the electron charge and T is the temperature.

In the case of an ideal amplifier, the output voltage measured between the supply terminal 1 and the output terminal 302 would become zero when no potential difference is applied between the input terminals 110a, 110b. However, this is generally not the case because all the components used for building the amplifier, and in particular, the components of the symmetrical arms of the stages, have a variation in their characteristics. This means that the output voltage of the amplifier is not zero in the absence of an input voltage. The state in which no input voltage is applied to the input of the amplifier is also referred to as an idle state in the remainder of the text.

Thus, an offset voltage is defined as being the voltage which must be applied between the input terminals 110a, 110b so that the output voltage of the amplifier available between the supply terminal 1 and the output terminal 302 is zero. A zero output voltage in the gain stage or gain stages is obtained when the base current, when idle in the transistor 304 at the input of the gain stage, has a given value denoted $I_E$. The value $I_E$ depends on the characteristic of the gain stage or stages.

It is required that the offset voltage should be as low as possible, and preferably zero. As a first approximation, the offset voltage is zero if the currents in the transistors 104a and 104b in the input arms are identical to each other when idle, and if the currents in the transistor 204a, 204b in the transforming arms are identical to each other.

This is the case if the current supplied by the current sources 208a and 208b are also identical to each other, and the current taken from the collector 203a of the transistor 204a in the first transforming arm 202a is equal to the current taken at the collector 203b of the transistor 204b in the second transforming arm 202b. In other words, it is necessary that, when idle, the base current of the transistor 207 in the compensation arm corresponds substantially to the input current of the gain stage 300.

The base current of the transistor 207 can be controlled by adjusting the current delivered by the current source 209 in the compensation arm. The current delivered by the current source 209 is consequently adjusted so that the offset voltage is substantially zero. When the transistor 207 in the compensation arm has characteristics substantially identical to those of the input transistor 304 in the gain stage 300, and, in particular, the same current gain, the current delivered by the current source 209 of the compensation arm is adjusted to be substantially equal to the emitter current of the transistor 304 in the gain stage.

The functioning of an amplifier according to the diagram in FIG. 1 does, however, has limits when the voltage available between the first and second supply terminals is low. In particular, transistors (not shown) used in the biasing current sources 208a, 208b may be saturated when the supply voltage is too low. By way of illustration, the base voltage of the transistor 207 in the compensation arm, that is, the voltage $V_B$ at node 203a, is such that:

$$V_b = V_{BE204a} + V_{BE207} + R_{106a} * (_{208} + I_{104a})$$

In this expression $V_{BE204a}$, $V_{BE207}$, $R_{106a}$, $I_{208}$ and $I_{104a}$ designate respectively the base-emitter voltage of the transistor 204a in the first transforming arm 202a, the base-emitter voltage of the transistor 207 in the compensation arm, the value of the resistor 106a in the first input arm, the current supplied by the biasing current source 208a in the first transforming arm, and the current passing through the input transistor 104a in the first input arm 102a. The base-emitter voltages of the bipolar transistors are such that $V_{BZ204a} \approx V_{BE207} \approx 0.75$ V. In addition, a value commonly adopted for the term $R_{106a} \approx (I_{208} + I_{104a})$ is on the order of 0.15 V. Lower voltages would be inappropriate for driving the following stages. Thus VB $\approx$1.650 V.

When the voltage $V_{CC}$ at the supply terminals is as low as $V_{CC}$=1.8 volts, the remaining voltage available for the biasing current source 208a in the first transforming arm is only 150 mV. In so far as the current source comprises a bipolar transistor, and a pnp type transistor, a voltage of around 150 mV between its emitter and collector terminals is close to a saturation value. To avoid the risk of saturation, it is therefore necessary to have a higher supply voltage which cannot attain values as low as 1.8 V.

FIG. 2 depicts a variation of the circuit in FIG. 1. This variation is one approach to the problem discussed above, but does not, however, prove entirely satisfactory. For reasons of convenience, parts of FIG. 2 which are identical, similar or equivalent to those of FIG. 1 are marked with the same references.

The diagram in FIG. 2 is identical to that of FIG. 1 with the exception of the compensation arm. This is replaced by a bypass arm 201 which connects the collector and base of the transistor 204a in the first transforming arm 202a. In other words, the bypass arm 201 connects node 203a to node 205.

By designating as $I_{208}$ as the biasing current delivered respectively by each current source 208a, 208b in the transforming stage 200, the base current of the transistors 204a, 204b is equal as a first approximation to $$\frac{I_{208}}{\beta},$$

where β is the current gain of these transistors. The diversion branch 201 consequently has passing through it a current substantially equal to $$\frac{2I_{208}}{\beta}.$$

In an amplifier in accordance with the diagram in FIG. 2, a centering of the offset voltage to a substantially zero value is accomplished when the bypass currents in each of the transforming branches 202a, 202b are balanced. Thus, the idle current entering the gain stage 300, that is, the base current of the input transistor 304 of this stage, must be substantially equal to the current passing through the diversion branch 201. The current is equal to $$\frac{2I_{208}}{\beta}.$$

Since the input transistor 304 has a current gain substantially equal to the gain β of the transistors in the transforming stage 200, the biasing current source 308 of the gain stage supplies a current $I_{305}$ such that $I_{305} \approx 2I_{208}$. Thus, for an amplifier in accordance with FIG. 2, the biasing currents cannot be chosen freely, but are chosen so that the biasing current $I_{208}$ of each of the transforming arms is a function of the gain stage current.

In the example illustrated, $$I_{208a} = I_{208b} = \frac{I_{308}}{2}$$

with $I_{208a} = I_{208b} = I_{208}$, and $I_{208a}$ $_{I208b}$ are respective currents in the first and second transforming arms. This link between the currents in the different arms form an important constraint in setting up the amplifier, and restricts its field of use. This is because the biasing current $I_{209}$ of the gain stage is generally fixed according to the performance required for the amplifier, such as, for example, certain dynamic behavior or the maximum value of the output current. Thus, in general, a biasing current $I_{309}$ of high value is sought.

However, the biasing currents in the transforming arms influence other parameters, such as the speed of operation, noise, and variations in the offset voltage, etc. For these parameters it may be necessary to choose biasing currents lower than $$\frac{I_{308}}{2}.$$

When the biasing currents in the transforming arms and the biasing current in the gain stage are linked, it is no longer possible to independently optimize the different operating parameters mentioned above. The choice of the biasing currents then necessarily results from a compromise between the different parameters.

By way of example, a high current value $I_{308}$ is desirable so that the amplifier can deliver high output currents. This choice necessitates also high values of the currents $I_{208a}$ and $I_{208b}$. However, high biasing currents for the transforming stage makes the amplifier sensitive with regards to its offset voltage, and to a variation in the characteristics of the components of the first and second transforming arms 202a and 202b.

Conversely, low biasing currents limit the output current of the amplifier. This is not desirable when the supply voltage available is also low. Thus, the approach disclosed in accordance with FIG. 2 would not be satisfactory.

SUMMARY OF THE INVENTION

In view of the foregoing, it is therefore an object of the present invention to provide an operational amplifier which permits the independent setting of the biasing currents of each stage, and thus to enable optimization of the different operating parameters of the amplifier.

Another object of the present invention is to provide an amplifier capable of functioning with low supply voltages as low as 1.8 volts without saturating the transistors therein.

Yet another object of the present invention is to provide an amplifier having a low idle current and a low idle consumption.

These and other objects, features and advantages in accordance with the present invention are provided by an operational amplifier comprising an input stage with first and second input arms forming a differential pair, and a level-transforming stage with first and second transforming arms each having at least one bipolar transistor. The bipolar transistors in the first and second transforming arms are respectively connected to the first and second input arms, and are connected together mutually by their bases. At least one gain stage is connected to the transistor in the second transforming arm.

In accordance with the present invention, a current terminal of the transistor in the first transforming arm is connected to the base of the transistor by a bypass arm. In addition, the amplifier has a centering arm that includes a centering transistor in series with a centering resistor. The centering transistor is connected by its base to those of the transistors in the transforming arms for controlling a current flowing in the bypass arm.

The current terminal of a transistor refers to a terminal through which the principal current of the transistor passes. In the case of a bipolar transistor, it is either the emitter terminal or the collector terminal. Biasing of the different arms, and, in particular, the transforming arms, may be accomplished using bipolar transistors.

However, by virtue of the characteristics of the present invention, the voltage available for biasing is greater than that existing in the circuits of the prior art. It therefore makes it possible to prevent saturation of the transistors thereof. This also includes the other transistors in the amplifier. The amplifier can thus be powered at supply voltages as low as 1.8 volts. Moreover, the values of the idle currents can be set independently for each of the stages of the amplifier. These aspects will be examined more precisely below in the description.

According to one embodiment of the amplifier, the transistors in the branches of the transforming stage may be chosen so that they are substantially identical. In this case, the value of the centering resistor is preferably chosen to set in the bypass arm a current equal to the input current of the gain stage. This choice of the centering resistor makes it possible to cancel out the offset voltage, or at least to make it as low as possible.

According to another embodiment of the amplifier, the transistors in the transforming branches may be an npn type, with an emitter terminal connected to one of the input arms and a collector terminal connected to a supply terminal by a biasing circuit. In this case, the collector of the transistor in the first transforming arm is connected to the base of the transistor by the bypass arm.

BRIEF DESCRIPTION OF THE DRAWINGS

Other characteristics and advantages of the invention will emerge more clearly from the description which follows, with reference to the figures in the accompanying drawings. This description is given purely for illustration and is not to be limited.

DETAILED DESCRIPTION OF THE PREFERRED EMBODIMENTS

Figure 1:
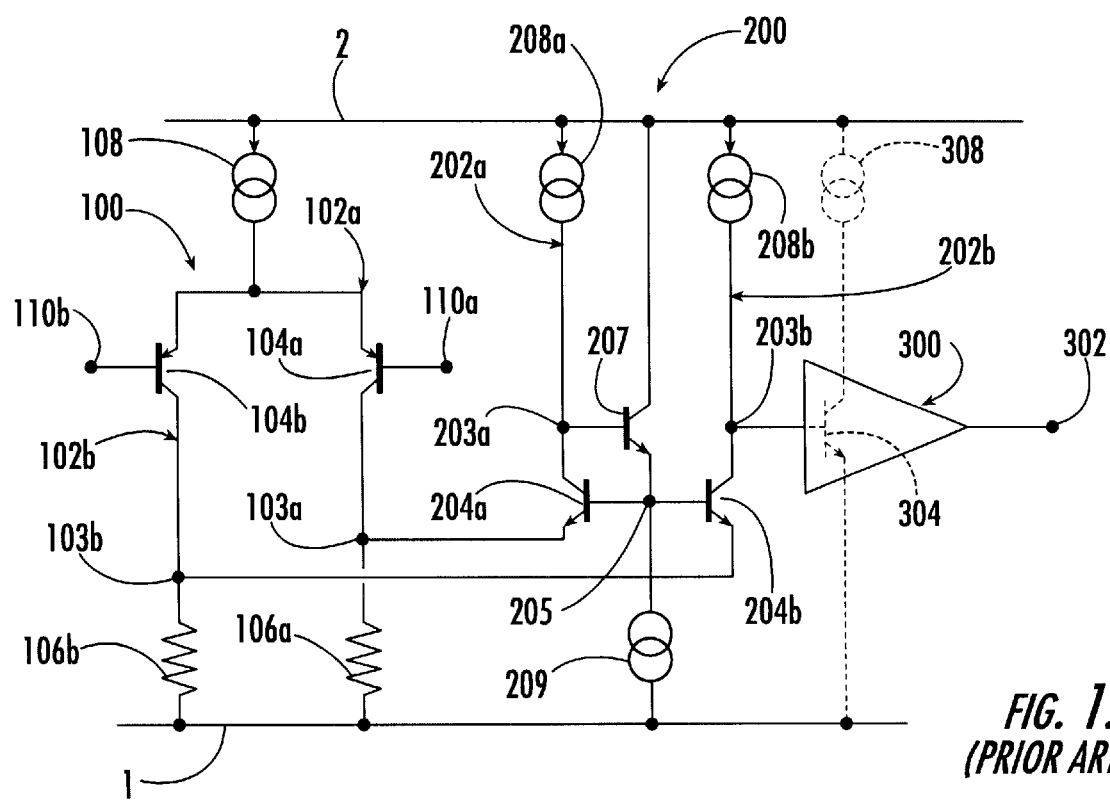
FIG. 1 is a schematic diagram of an operational amplifier in accordance with the prior art.
Figure 3:
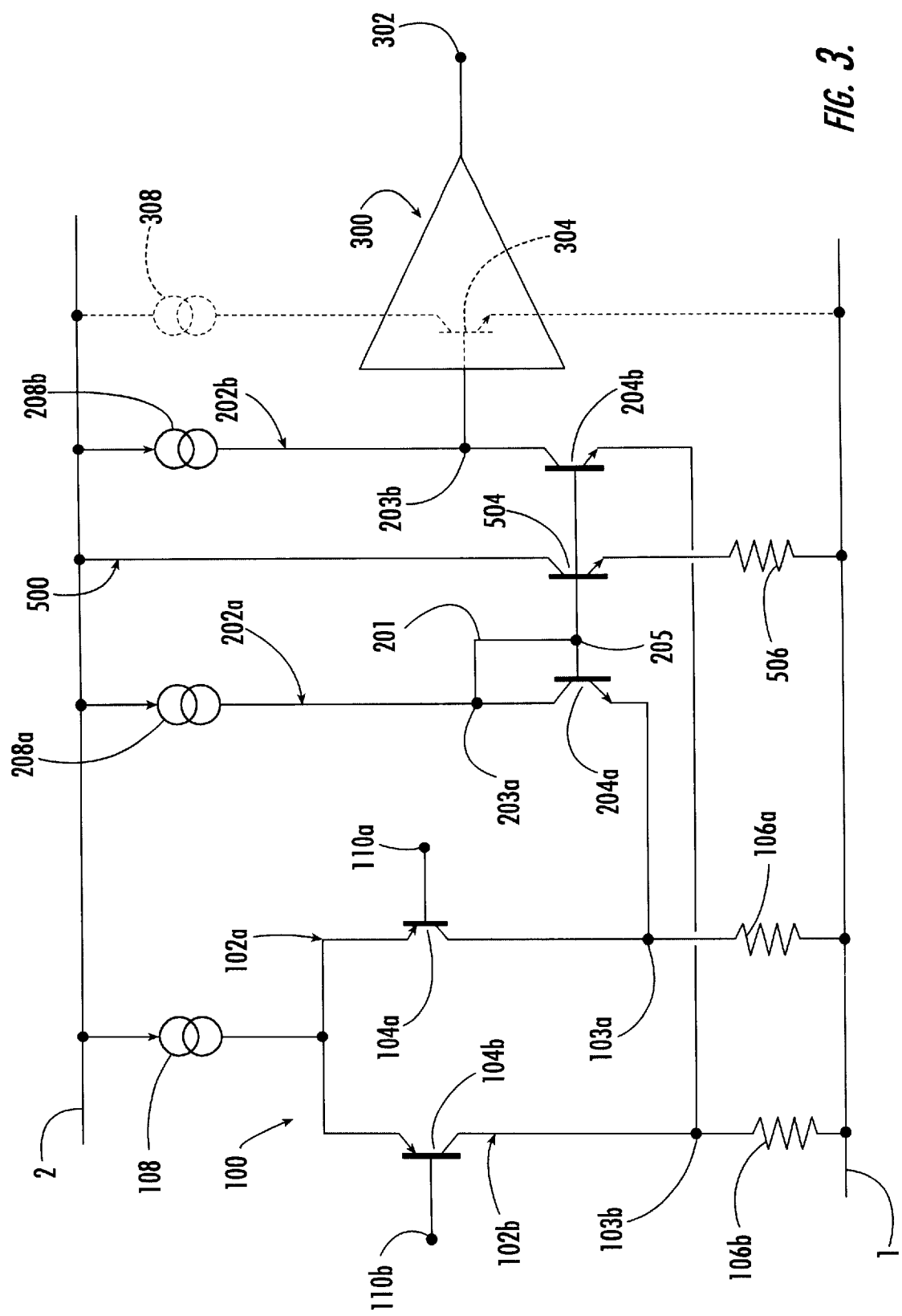
FIG. 3 is a schematic diagram of an operational amplifier in accordance with the present invention.

The amplifier corresponding to FIG. 3 has, with that of FIG. 1, a large number of common characteristics whose descriptions are not repeated here. However, the elements identical or similar to those already described with reference to FIG. 1 include the same reference numerals, and reference can therefore be made to the above description for these elements.

The transistor 204a in the first transforming arm has a current terminal, in this case its collector terminal, connected to its base terminal by a bypass arm 201. The bypass arm 201 connects node 203a to node 205. In addition, a centering arm 500 includes a bipolar transistor 504 whose base is connected to node 205, that is, to the base of the transistors 204a and 204b in the transforming arms. The transistor 504 is connected in series with a centering resistor 506 between the supply terminals.

In the illustrated example, the transistor 504 is an npn transistor whose collector is connected to the second supply terminal 2, and whose emitter is connected to the first supply terminal 1 by the centering resistor 506. To provide centering of the offset voltage of the amplifier, that is, to set this voltage at a substantially zero value, it is necessary to take at node 203a in the first transforming arm a current substantially equal to the current taken at node 203b in the second transforming arm. In other words, the current in the bypass arm 201 is adjusted so that it is to be substantially equal to the current directed to the input transistor 304 in the gain stage 300.

The adjustment of the current in the bypass arm 201 is accomplished by choosing the value of the centering resistor 506. The choice of the centering resistor makes it possible to set the current passing through the current terminals (collector and emitter) of the centering transistor 504, and therefore its base current. This base current, added to the bases of the transistors 204a, 204b in the transforming arms, determines the current in the bypass arm 201.

Figure 2:
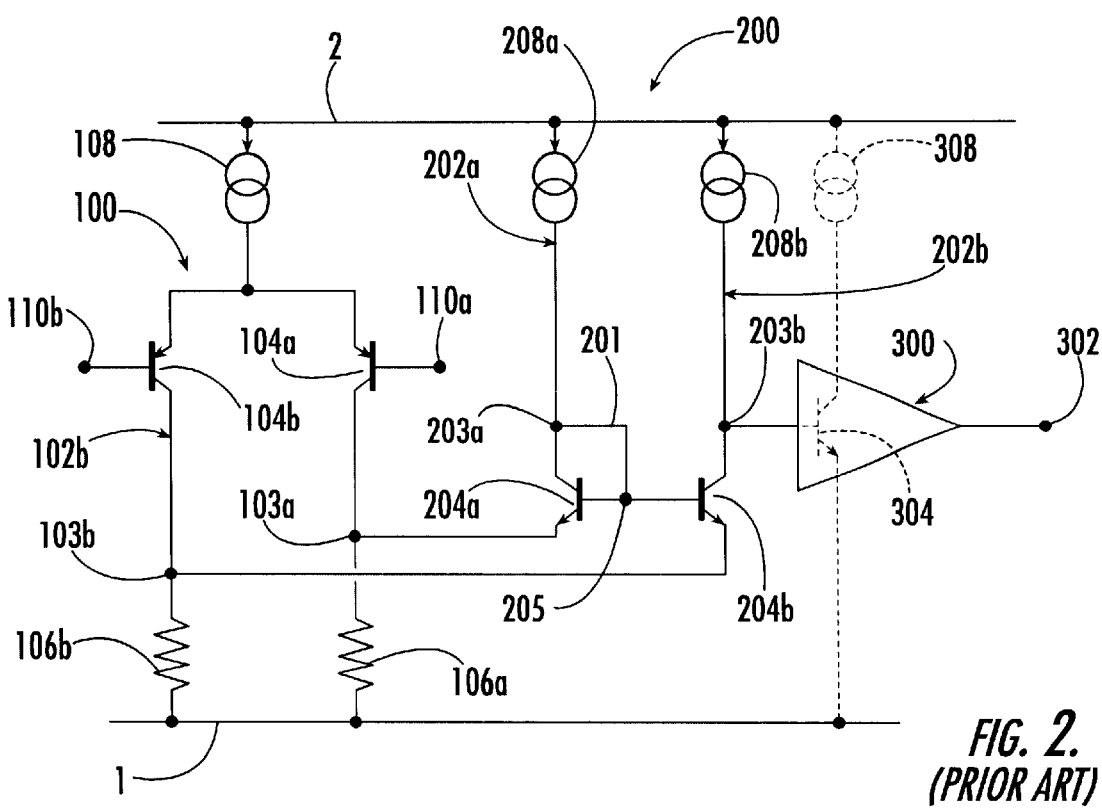
FIG. 2 is a schematic diagram of a variation of the amplifier illustrated in FIG. 1.

Based upon the characteristics of the centering arm, it is possible to set the biasing currents in the centering arm independently of the biasing current $I_{308}$ passing through the input transistor 304 in the gain stage 300. Keeping the notations used in FIG. 2, it is therefore possible to choose the current $I_{308}$ so that $2I_{308a} < I_{308}$ and $2I_{208b} < I_{308}$.

In the example illustrated, $I_{208a} = I_{208b}$. The ability to set the biasing currents is important since this makes it possible to set a relatively high current in the gain stages, and a relatively low current in the level-transforming stage. A high current in the gain stages makes it possible to control a high output current. This possibility is particularly advantageous for controlling loads supplied at a low supply voltage. Nonetheless, a low current in the transforming stage provides less sensitivity of the amplifier due to the variations in characteristics of the components. A low current in the transforming stage also reduces variations in the centering voltage obtained.

In FIG. 3, the collector voltage of the transistor in the first transforming arm, that is, the voltage $V_{203a}$ at node 203a is such that $V_{203a} = V_{Be204a} + R_{106a} (I_{208} + I_{106a})$. In this expression, $V_{BE204a}$, $V_{BE207}$, $R_{106a}$, $I_{208}$ and $I_{104a}$ designate respectively the base-emitter voltage of the transistor 204a in the first transforming arm 202a, the value of the resistor 106a in the first input arm, the current supplied by the biasing current source 208a in the first transforming arm, and the current passing through the input transistor 104a in the first input arm 102a. By comparison with the circuit in FIG. 1 and referring to the expression of $V_B$ given above, $V_{203a} = V_B - V_{BE207}$, $V_{203a} \approx V_B - 0.750$ volts.

It is thus found that, by virtue of the particular embodiment of the centering arm of the invention which uses a base current for balancing the transforming arms, a higher operating voltage is available for the current sources of the transforming arms, and, in particular, for the current source 208a in the first arm. This limits the risk of saturating the transistors of the current sources.

What is claimed is:

1. An operational amplifier comprising:
   an input stage including first and second input arms forming a differential input;
   a level-transforming stage including a first transforming arm comprising a first bipolar transistor and a second transforming arm comprising a second bipolar transistor, said first and second bipolar transistors each comprising a base, collector and emitter, said first bipolar transistor is connected to the first input arm and said second bipolar transistor is connected to the second input arm, the base of said first bipolar transistor is connected to the base of said second bipolar transistor;
   a bypass arm connected between the collector and the base of said first bipolar transistor;
   a centering arm comprising a centering transistor connected in series with a centering resistor, said centering transistor comprising a base connected to the base of said first and second bipolar transistors to control a current conducting in the bypass arm; and
   at least one gain stage connected to said second bipolar transistor.

2. An amplifier according to claim 1, wherein said first and second bipolar transistors are substantially identical.

3. An amplifier according to claim 1, wherein said centering resistor has a value so that a current conducting in the bypass arm is substantially equal to an input current of said gain stage.

4. An amplifier according to claim 1, further comprising:
   a first biasing circuit in the first transforming arm connected to a first voltage reference and to the collector of said first bipolar transistor; and
   a second biasing circuit in the second transforming arm connected to the first voltage reference and to the collector of said second bipolar transistor.

5. An amplifier according to claim 4, wherein said first and second biasing circuits provide a respective biasing current that is less than a biasing current in said gain stage.

6. An amplifier according to claim 1, wherein the emitter of said first bipolar transistor is connected to the first input arm, and the emitter of said second bipolar transistor is connected to the second input arm.

7. An amplifier according to claim 1, wherein the first input arm comprises a first input transistor connected in series with a first resistor, and a common node between said first resistor and said first input transistor is connected to the emitter of said first bipolar transistor; and wherein the second input arm comprises a second input transistor connected in series with a second resistor, and a common node between said second resistor and said second input transistor is connected to the emitter of said second bipolar transistor.

8. An operational amplifier according to claim 1, further comprising first and second voltage references; and wherein the first and second input arms and the first and second transforming arms are biased between the first and second voltage references so that a voltage greater than or equal to about 1.8 volts is provided to the first and second transistors.

9. An operational amplifier comprising:
   an input stage including first and second input arms forming a differential input;
   a level-transforming stage including a first transforming arm comprising a first transistor and a second transforming arm comprising a second transistor, said first and second transistors each comprising a control terminal, a first conduction terminal and a second conduction terminal, said first transistor is connected to the first input arm of said input stage and said second transistor is connected to the second input arm of said input stage, the control terminal of said first transistor is connected to the control terminal of said second transistor;
   a first biasing circuit in the first transforming arm connected to a first voltage reference and to the first conduction terminal of said first transistor;
   a second biasing circuit in the second transforming arm connected to the first voltage reference and to the first conduction terminal of said second transistor;
   a bypass arm connected between the first conduction terminal and the control terminal of said first transistor;
   a centering arm comprising a centering transistor connected in series with a centering resistor, said centering transistor comprising a control terminal connected to the control terminals of said first and second transistors to control a current conducting in the bypass arm; and
   at least one gain stage connected to said second transistor.

10. An amplifier according to claim 9, wherein the first input arm comprises a first input transistor connected in series with a first resistor, and a common node between said first resistor and said first input transistor is connected to the second control terminal of said first transistor; and wherein the second input arm comprises a second input transistor connected in series with a second resistor, and a common node between said second resistor and said second input transistor is connected to the second control terminal of said second transistor.

11. An amplifier according to claim 9, wherein said first and second transistors are substantially identical.

12. An amplifier according to claim 9, wherein said centering resistor has a value so that a current conducting in the bypass arm is substantially equal to an input current of said gain stage.

13. An amplifier according to claim 9, wherein said first and second biasing circuits provide a respective biasing current that is less than a biasing current in said gain stage.

14. An operational amplifier according to claim 9, further comprising a third biasing circuit connected to said input stage; and wherein said first, second and third biasing circuits input stage and the first and second transforming arms biased said between the first voltage reference and a second voltage reference so that a voltage greater than or equal to about 1.8 volts is provided to the first and second transistors.

15. An operational amplifier according to claim 9, wherein said first and second transistors each comprises a bipolar transistor.

16. A method for making an operational amplifier comprising:

forming a differential input stage including first and second input arms;

forming a level-transforming stage including a first transforming arm comprising a first transistor and a second transforming arm comprising a second transistor, the first and second transistors each comprising a control terminal, a first conduction terminal and a second conduction terminal, the first transistor is connected to the first input arm of the input stage and the second transistor is connected to the second input arm of the input stage, the control terminal of the first transistor is connected to the control terminal of the second transistor;

forming a bypass arm connected between the first conduction terminal and the control terminal of the first transistor;

forming a centering arm comprising a centering transistor connected in series with a centering resistor, the centering transistor comprising a control terminal connected to the control terminals of the first and second transistors to control a current conducting in the bypass arm; and forming at least one gain stage connected to the second transistor.

17. An method according to claim 16 wherein forming the first input arm comprises connecting a first input transistor in series with a first resistor, and a common node between the first resistor and the first input transistor is connected to the second control terminal of the first transistor; and wherein forming the second input arm comprises connecting a second input transistor in series with a second resistor, and a common node between the second resistor and the second input transistor is connected to the second control terminal of the second transistor.

18. A method according to claim 16, wherein the first and second transistors are substantially identical.

19. A method according to claim 16, further comprising selecting a value for the centering resistor so that a current conducting in the bypass arm is substantially equal to an input current of the gain stage.

20. A method according to claim 16, further comprising:

biasing the first transistor using a first biasing circuit; and biasing the second transistor using a second biasing circuit.

21. A method according to claim 20, wherein the first and second biasing circuits provide a respective biasing current that is less than a biasing current in the gain stage.

22. A method according to claim 16, further comprising biasing the input stage and the first and second transforming arms between a first voltage reference and a second voltage reference so that a voltage greater than or equal to about 1.8 volts is provided to the first and second transistors.

23. A method according to claim 16, wherein the first and second transistors each comprises a bipolar transistor.

* * * * *

UNITED STATES PATENT AND TRADEMARK OFFICE
CERTIFICATE OF CORRECTION

PATENT NO. : 6,456,162 B1
DATED : September 24, 2002
INVENTOR(S) : Frédéric Goutti It is certified that error appears in the above-identified patent and that said Letters Patent is hereby corrected as shown below:

<u>Column 3,</u>
Line 50, delete "$V_b = V_{BE204a} + V_{BE207} + R_{106a} * (_{208} + I_{104a})$" insert
-- $V_B = V_{BE204a} + V_{BE207} + R_{106a} * (I_{208} + I_{104a})$ --
Line 61, delete "$R_{106a} \approx (I_{208} + I_{104a})$" insert -- $R_{106a} * (I_{208} + I_{104a})$ --

<u>Column 4,</u>
Line 59, delete "$I_{208a}$ $_{I208b}$" insert -- $I_{208a}$, $I_{208b}$ --

Signed and Sealed this

Third Day of June, 2003

JAMES E. ROGAN
*Director of the United States Patent and Trademark Office*